United States Patent
Tsuji et al.

[11] Patent Number: 6,031,781
[45] Date of Patent: Feb. 29, 2000

[54] SEMICONDUCTOR MEMORY DEVICE ALLOWING HIGH-SPEED ACTIVATION OF INTERNAL CIRCUIT

[75] Inventors: Takaharu Tsuji; Shigeki Tomishima; Tsukasa Ooishi; Masatoshi Ishikawa, all of Hyogo, Japan

[73] Assignee: Mitsubishi Denki Kabushiki Kaisha, Tokyo, Japan

[21] Appl. No.: 09/326,547

[22] Filed: Jun. 7, 1999

[30] Foreign Application Priority Data

Dec. 21, 1998 [JP] Japan ................................ 10-362369

[51] Int. Cl.$^7$ .................................................. G11C 5/14
[52] U.S. Cl. ............................ 365/227; 365/226; 365/63; 365/230.03; 365/230.06; 365/233
[58] Field of Search .......................... 365/230.03, 230.06, 365/233, 227, 226, 63, 233.5

[56] References Cited

U.S. PATENT DOCUMENTS 5,734,604  3/1998  Akamatsu et al. ...................... 365/156
5,764,566  6/1998  Akamatsu et al. ...................... 365/156
5,822,265  10/1998  Zdenek ................................... 365/222

OTHER PUBLICATIONS

"Subthreshold–Current Reduction Circuits for Multi–Gigabit DRAM's", by T. Sakata et al., IEEE Journal of Solid–State Circuits, vol. 29, No. 7, Jul. 1994, pp 761–769.

*Primary Examiner*—Andrew Q. Tran
*Attorney, Agent, or Firm*—McDermott, Will & Emery

[57] ABSTRACT

Row decoders RD are provided corresponding to memory blocks, respectively. Row decoders RD each operate receiving an operating power supply voltage from a hierarchical power supply system constituted of a main power supply line and a sub power supply line. With the use of a bank activation signal ACT, the main power supply line and the sub power supply line for all the hierarchical power supply system short circuit and a voltage of the sub power supply line is recovered. Thereafter, the main power supply line and the sub power supply line are cut off for a row decoder RD of a non-selected memory block based on a block selection signal BS supplied through a decoding operation.

5 Claims, 19 Drawing Sheets

SEMICONDUCTOR MEMORY DEVICE ALLOWING HIGH-SPEED ACTIVATION OF INTERNAL CIRCUIT

BACKGROUND OF THE INVENTION

1. Field of the Invention

The present invention relates to a semiconductor memory device and more particularly to a semiconductor memory device having a circuit controlling an operation of a memory array based on a result of address decoding.

2. Description of the Background Art

A conventional semiconductor memory device will be described with reference to FIG. 19. A conventional semiconductor memory device as shown in FIG. 19 includes a decoder 901 decoding an address, internal circuits 902#0–902#n, and power supply control circuits 904#0–904 #n.

Decoder 901 decodes an address in response to a bank activation signal ACT and outputs decoding signals B1(0) –B1(n) and B2(0)–B2(m) (in the drawing, m=1) (hereinafter decoding signals B1(0)–B1(n) will be collectively referred to as decoding signal B1, and decoding signals B2(0)–B2 (m) will be collectively referred to as decoding signal B2). Power supply control circuits 904#0–904#n are provided corresponding to internal circuits 902#0–902#n, respectively. Power supply control circuit 904#0–904#n are each activated in response to decoding signal B1. Based on the decoding signal B1, one of power supply signals V(0)–V(n) supplied from power supply control circuits 904#0–904#n as outputs is activated (hereinafter, power supply signals V(0)–V(n) are collectively referred to as power supply signal V).

Internal circuits 902#0–902#n are each activated when decoding signals B1 and B2 and power supply signal V corresponding thereto are all activated. The power supply control circuit is a circuit for supplying power to a part of the internal circuit and is employed for reducing the current consumption of the internal circuit in a standby state and for reducing the number of elements in the internal circuit.

The structure of the conventional semiconductor memory device described above has the following problem. With reference to a timing chart shown in FIG. 20, the problem of the conventional semiconductor memory device will be described. In FIG. 20, character B indicates a decoding signal (corresponding to an output of decoder 901 shown in FIG. 19), character ACT indicates a bank activation signal for activating a memory cell array, character V indicates a power supply signal (corresponding to one of power supply signals V(0)–V(n) shown in FIG. 19), and character STATE indicates a state of an internal circuit (corresponding to one of internal circuits 902#0, . . . , 902#n shown in FIG. 19) operating based on decoding signal B.

In FIG. 20, transition from a standby cycle to an active cycle occurs at time t1. Bank activation signal ACT is set to an H (a logical high) level (VCC) in the active cycle and to an L (a logical low) level (GND) in the standby cycle. During the standby cycle, all decoding signals B are at an L level and the internal circuit is not in an operation (STATE is at an L level).

With reference to FIG. 20, bank activation signal ACT is turned to an H level at the outset of the active cycle. Decoding signal B rises to an H level at time t2 (>t1) in response thereto. Power supply signal V is activated at time t3 (>t2) in response thereto. The internal circuit is activated at time t4 (>t3) in response thereto (that is, STATE is turned to an H level).

As described above, power supply signal V is activated in response to decoding signal B1. Hence, power supply signal V is not activated until time t3 after the activation of decoding signal B1 at time t2. Therefore, the state of the internal circuit STATE is not determined before time t4 after time t3.

Thus, in the structure of the conventional semiconductor memory device, at least time (t4–t2) is required to turn the internal circuit into a desired state (that is, to turn STATE into an H level), whereby high speed operation cannot be achieved.

SUMMARY OF THE INVENTION

An object of the present invention is, therefore, to provide a semiconductor memory device capable of a high speed operation by avoiding a delay attributable to a power supply control circuit operating with the use of a decoding signal.

A semiconductor memory device in accordance with the present invention includes: a plurality of memory blocks each including a plurality of memory cells; a decoder responsive to an external address for outputting a decoding signal for selecting a particular memory block among the plurality of memory blocks; a plurality of internal circuits provided corresponding to the plurality of memory blocks, respectively, for selectively controlling an operation of a corresponding memory block based on a corresponding decoding signal supplied from the decoder; and a control circuit for controlling so as to turn each of the plurality of internal circuits into an active state prior to a decoding operation in the decoder, and to selectively maintain the active state or turn to an inactive state based on the decoding signal in an active cycle.

Thus, a main advantage of the present invention is that a desired operation can be achieved immediately after the address decoding, by turning the internal circuit controlled based on the decoding signal into an active state prior to the decoding operation.

Particularly, an operating power supply voltage is supplied to the internal circuit through the activation of an entire hierarchical power supply system with the use of a signal activated at a faster timing than the decoding signal. Then, the hierarchical power supply system is selectively inactivated in response to a result of the decoding. Thus, the operation speed of the internal circuit receiving power supply is increased and current consumption in the internal circuit which is not selected can be reduced.

In particular, a word line driving circuit (the internal circuit) is turned into a state allowing activation thereof with the use of a signal activated at a faster timing than the decoding signal, and selectively turned into a reset state in response to the result of decoding. Thus, the word lines can be activated at a faster timing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
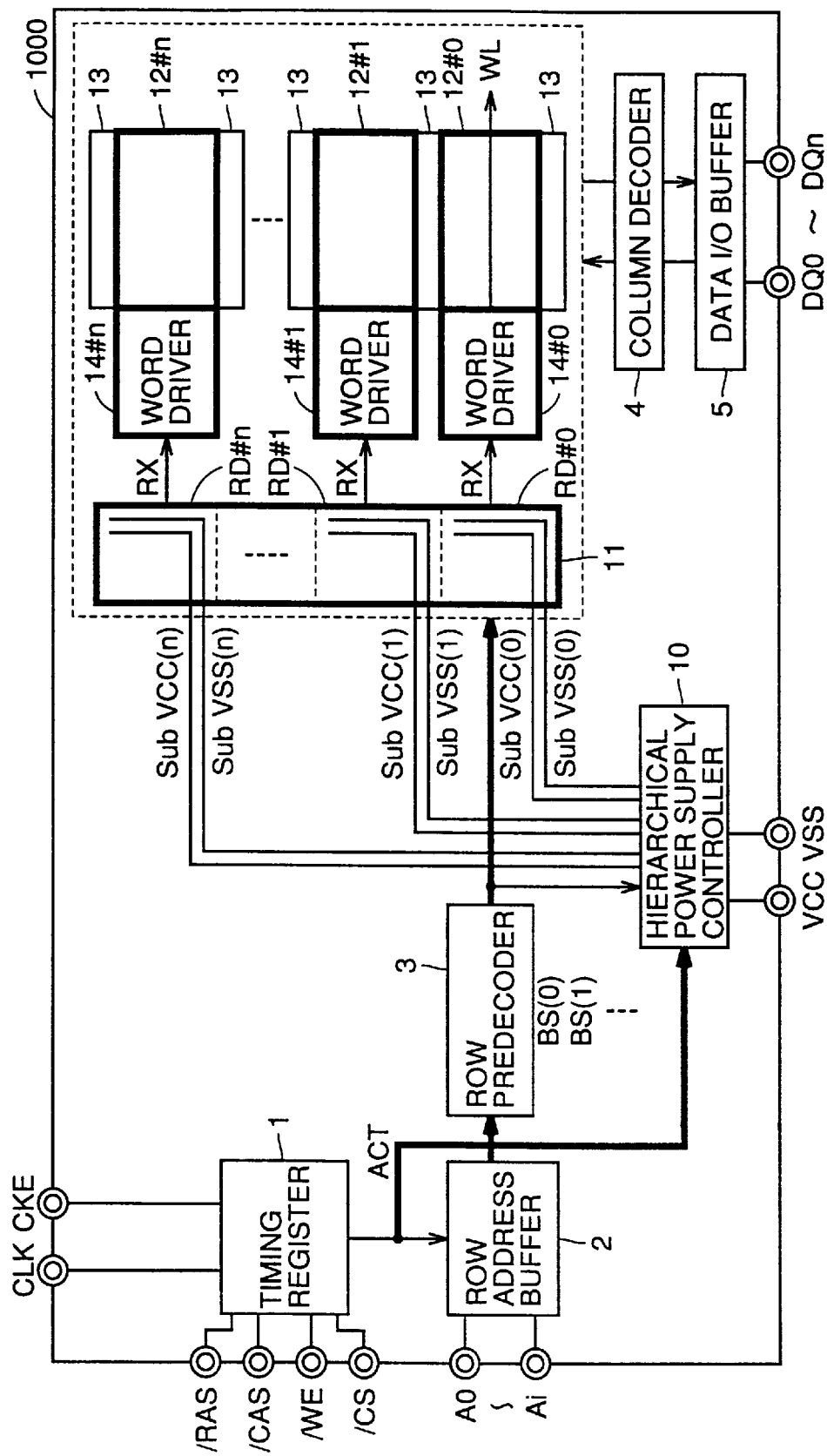
FIG. 1 is a block diagram showing an overall structure of a semiconductor memory device 1000 according to a first embodiment of the present invention.

With reference to FIG. 1, an overall structure of a semiconductor memory device 1000 according to the first embodiment of the present invention will be described.

With reference to FIG. 1, semiconductor memory device 1000 includes a timing register 1, a row address buffer 2, a row predecoder 3, a hierarchical power supply controller 10, a row decoder unit 11, word drivers 14#0, 14#1, . . . , 14#n, an array portion, a column decoder 4 and a data I/O (input/output) buffer 5.

Timing register 1 receives external signals (an external row address strobe signal /RAS, an external column address strobe signal /CAS, an external chip select signal /CS, an external write enable signal /WE, and so on) and outputs an internal control signal. For example, timing register 1 outputs a bank activation signal ACT for activating the array portion. Row address buffer 2 outputs an internal row address signal in response to external address signals A0–Ai.

The array portion is constituted of memory blocks 12#0–12#n and a sense amplifier block 13 is arranged between each of memory blocks 12#0–12#n (hereinafter collectively referred to as memory block 12). Adjacent memory blocks 12 share sense amplifier block 13 arranged therebetween. Memory block 12 each includes a plurality of memory cells and a plurality of word lines.

Data I/O buffer 5 serves for transmission of a signal between data I/O pins DQO-DQn and the array portion. Column decoder 4 is arranged between data I/O buffer 5 and the array portion.

Row predecoder 3 predecodes an output from row address buffer 2 and supplies as an output a decoding signal. Row predecoder 3 also supplies as outputs block selection signals BS(0), BS(1), . . . (hereinafter collectively referred to as block selection signal BS) for selecting a memory block.

Row decoder unit 11 includes row decoders RD#0, RD#1, . . . , RD#n (hereinafter collectively referred to as row decoder RD). Row decoder RD is each arranged corresponding to a memory block. Word drivers 14#0, 14#1, . . . , 14#n (hereinafter collectively referred to as word driver 14) are arranged corresponding to memory blocks 12, respectively. Word driver 14 receives an output (indicated by character RX in the drawing) of a corresponding row decoder RD and activates a word line WL of a corresponding memory block 12.

Row decoder RD operates receiving an operating power supply voltage from a hierarchical power supply system constituted of two power supply lines, that is, a main power supply line and a sub power supply line. Next, the relation between row decoder RD and the hierarchical power supply system will be described with reference to FIG. 2.

Figure 2:
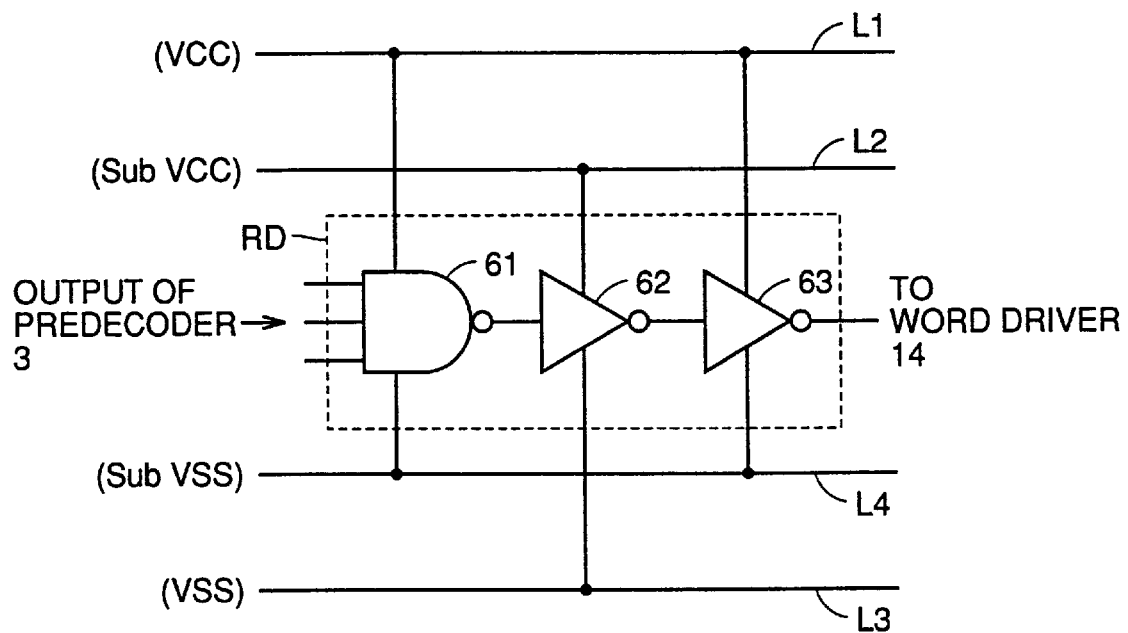
FIG. 2 is a diagram referenced for describing a relation between a row decoder RD and a hierarchical power supply system.

With reference to FIG. 2, row decoder RD includes an NAND circuit 61, and inverters 62 and 63. NAND circuit 61 and inverters 62 and 63 are connected in series.

NAND circuit 61 and inverter 63 receive operating power supply voltages (VCC, Sub VSS) from a main power supply voltage line L1 and a sub ground voltage line L4 and perform a logical operation. Inverter 62 receives operating power supply voltages (Sub VCC, VSS) from a sub power supply voltage line L2 and a main ground voltage line L3 and perform a logical operation. Hereinafter, main power supply voltage line L1 and main ground voltage line L3 are collectively referred to as a main power supply line, and sub power supply voltage line L2 and sub ground voltage line L4 are collectively referred to as a sub power supply line. NAND circuit 61 receives a predecoding signal from row predecoder 3. Word driver 14 is driven based on an output from a corresponding inverter 63.

With reference to FIG. 1, hierarchical power supply controller 10 controls a voltage of the sub power supply line of each row decoder RD. To be specific, hierarchical power supply controller 10 controls a voltage Sub VCC(0) on the sub power supply voltage line and a voltage Sub VSS(0) on the sub ground voltage line for row decoder RD#0, a voltage Sub VCC(1) on the sub power supply voltage line and a voltage Sub VSS(1) on the sub ground voltage line for row decoder RD#1, a voltage Sub VCC(n) on the sub power supply voltage line and a voltage Sub VSS(n) on the sub ground voltage line for row decoder RD#n, and so on.

Next, with reference to FIG. 3, the relation between hierarchical power supply controller 10 shown in FIG. 1 and the voltage of the sub power supply line will be described.

Figure 3:
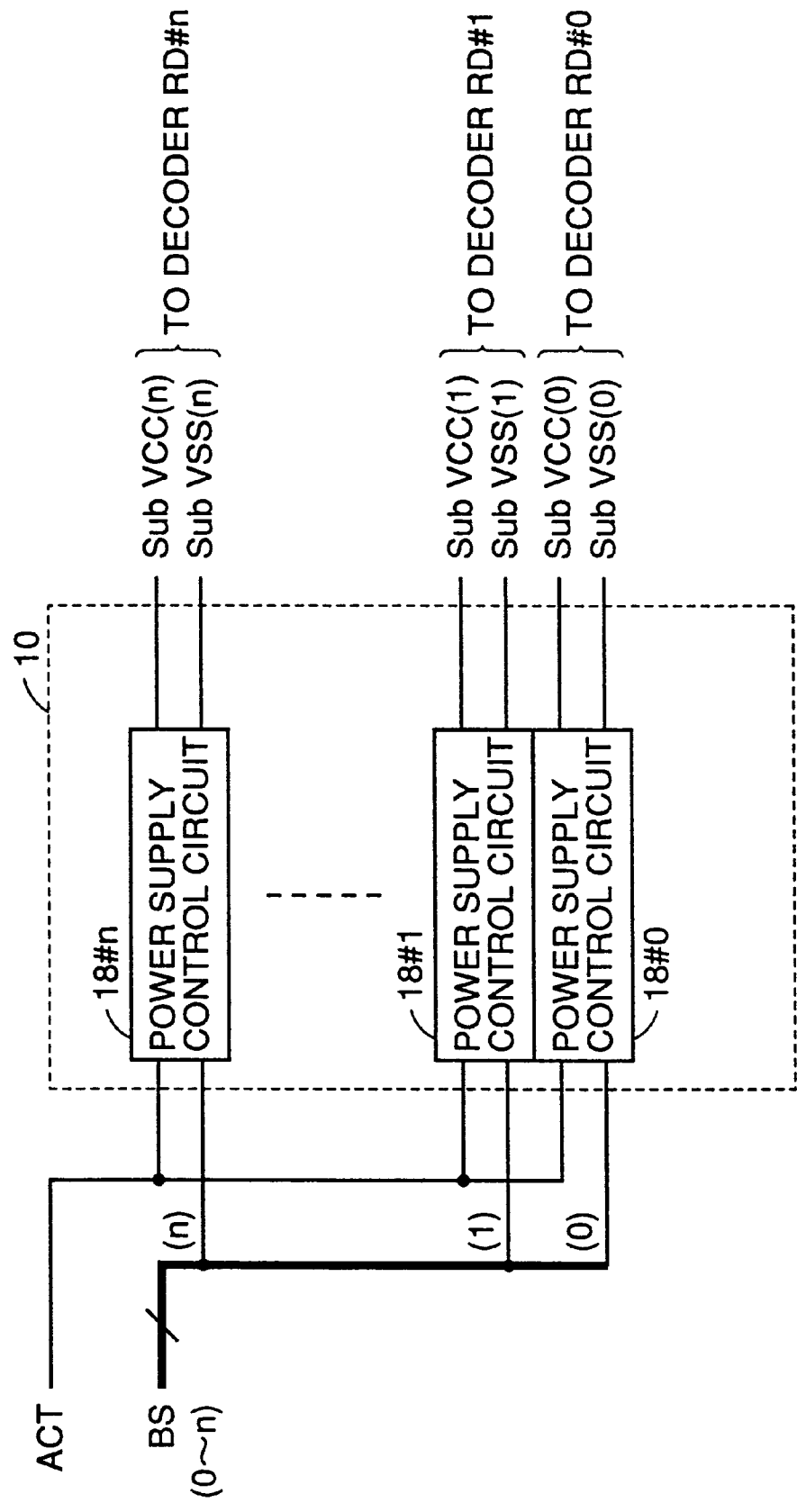
FIG. 3 is a schematic block diagram showing a hierarchical power supply controller 10 shown in FIG. 1.

With reference to FIG. 3, hierarchical power supply controller 10 includes power supply control circuits 18#0, 18#1, . . . , 18#n (hereinafter collectively referred to as power supply control circuit 18). Power supply control circuits 18 are arranged corresponding to memory blocks 12, respectively.

Power supply control circuit 18 controls the voltage of the corresponding sub power supply voltage line based on bank activation signal ACT from timing register 1 and block selection signal BS from row predecoder 3.

For example, power supply control circuit 18#0 controls the voltages on the sub power supply lines (voltage Sub VCC(0) and voltage Sub VSS(0)) for row decoder RD#0 based on bank activation signal ACT and block selection signal BS(0).

Next, a specific structure of each of power supply control circuits 18#0–18#n will be described with reference to FIGS. 4 and 5. In FIG. 5, row decoder RD is also shown for reference.

Figure 4:
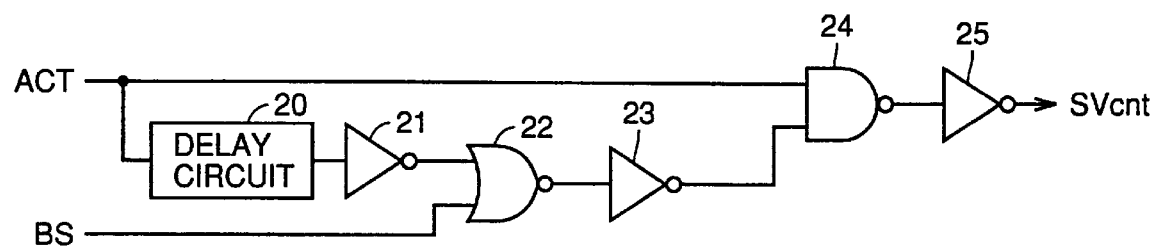
FIGS. 4 and 5 are schematic diagrams referenced for describing a specific structure of a power supply control circuit shown in FIG. 3.
Figure 5:
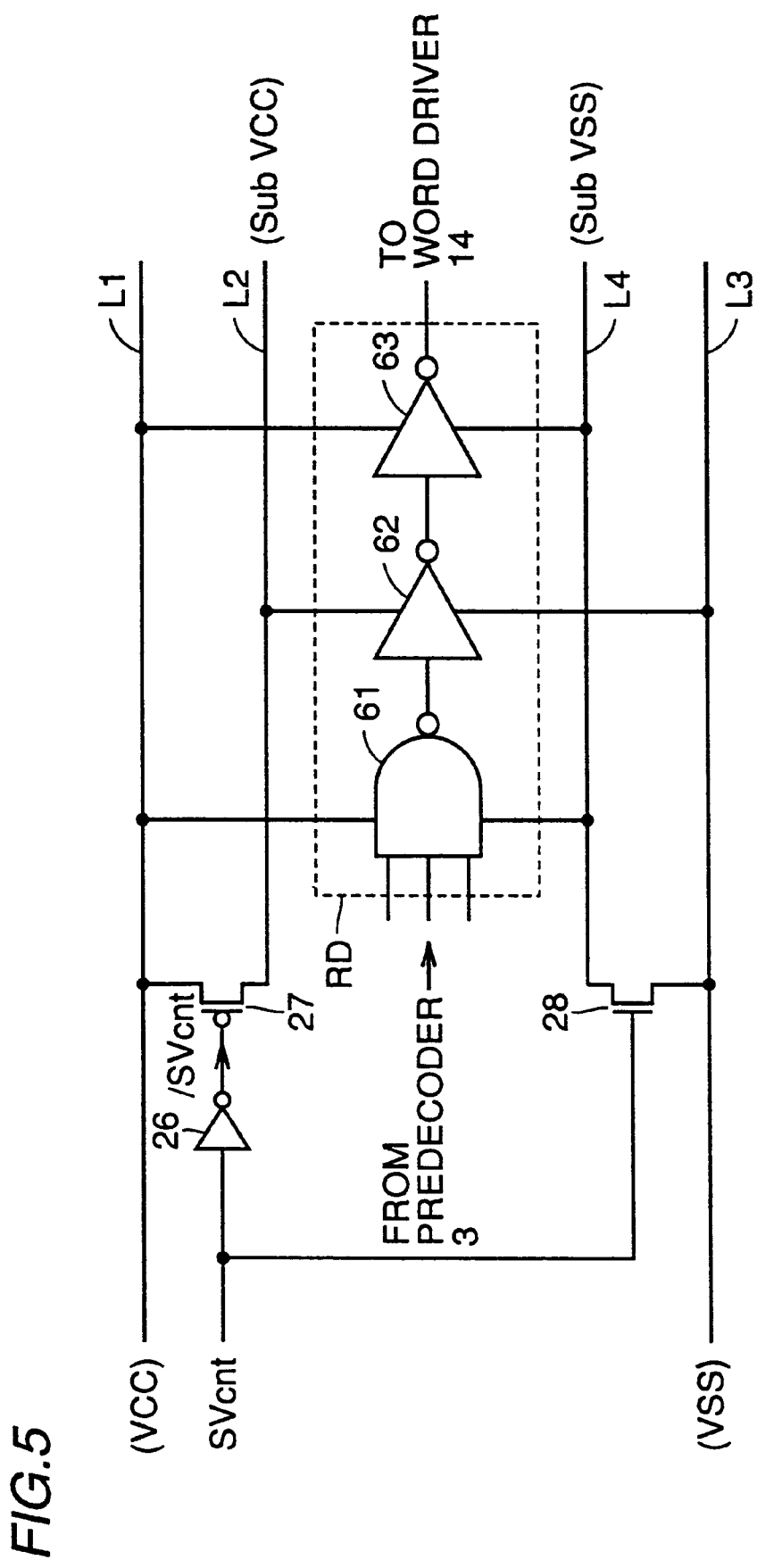

With reference to FIG. 4, the power supply control circuit includes a delay circuit 20, inverters 21, 23 and 25, an NOR circuit 22, and an NAND circuit 24. Delay circuit 20 delays bank activation signal ACT and outputs the resulting signal. Inverter 21 inverts the output of delay circuit 20. NOR circuit 22 receives the output of inverter 21 and a corresponding block selection signal BS. Inverter 23 inverts the output of NOR circuit 22. NAND circuit 24 receives bank activation signal ACT and the output of inverter 23. Inverter 25 inverts the output of NOR circuit 24 and supplies as an output a power supply control signal SVcnt.

With reference to FIG. 5, the power supply control circuit further includes an inverter 26, and switch transistors 27 and 28. Switch transistor 27 is a PMOS transistor and switch transistor 28 is an NMOS transistor.

Inverter 26 inverts power supply control signal SVcnt and outputs a power supply control signal /SVcnt. Switch transistor 27 is turned on in response to power supply control signal /SVcnt. Switch transistor 28 is turned on in response to power supply control signal SVcnt. When switch transistor 27 is turned on, main power supply voltage line L1 supplying power supply voltage VCC and sub power supply voltage line L2 are electrically connected. When switch transistor 28 is turned on, main ground voltage line L3 supplying ground voltage VSS and sub ground voltage line L4 are electrically connected.

An operation of a circuit shown in FIG. 5 in the standby cycle will be described with reference to FIG. 6. In the drawing, characters (H) and (L) represent the state of each node in the standby cycle.

Figure 6:
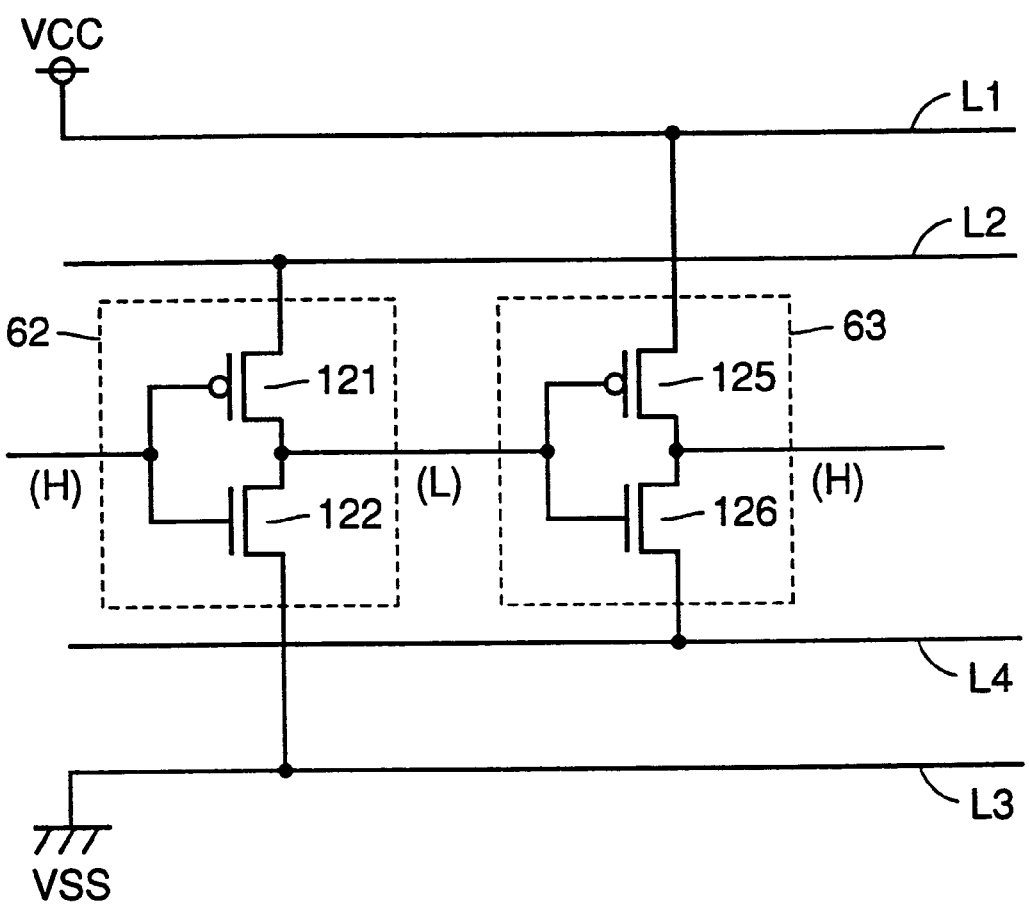
FIG. 6 is a diagram referenced for describing an operation of a circuit shown in FIG. 5 in the standby cycle.

With reference to FIG. 6, an inverter 62 includes a PMOS transistor 121 and an NMOS transistor 122. An inverter 63 includes a PMOS transistor 125 and an NMOS transistor 126. PMOS transistor 125 is connected to main power supply voltage line L1 and NMOS transistor 126 is connected to sub ground voltage line L4. PMOS transistor 121 is connected to sub power supply voltage line L2 and NMOS transistor 122 is connected to main ground voltage line L3.

In the standby cycle, an input node of inverter 62 is at an H level and an input node of inverter 63 is at an L level. Here, switch transistors 27 and 28 are turned off to render the main power supply line and the sub power supply line a cut-off state. Then the sub power supply line is turned to a floating state. Then, a leakage current flowing through PMOS transistor 121 and a leakage current flowing through NMOS transistor 126 are suppressed.

Figure 7:
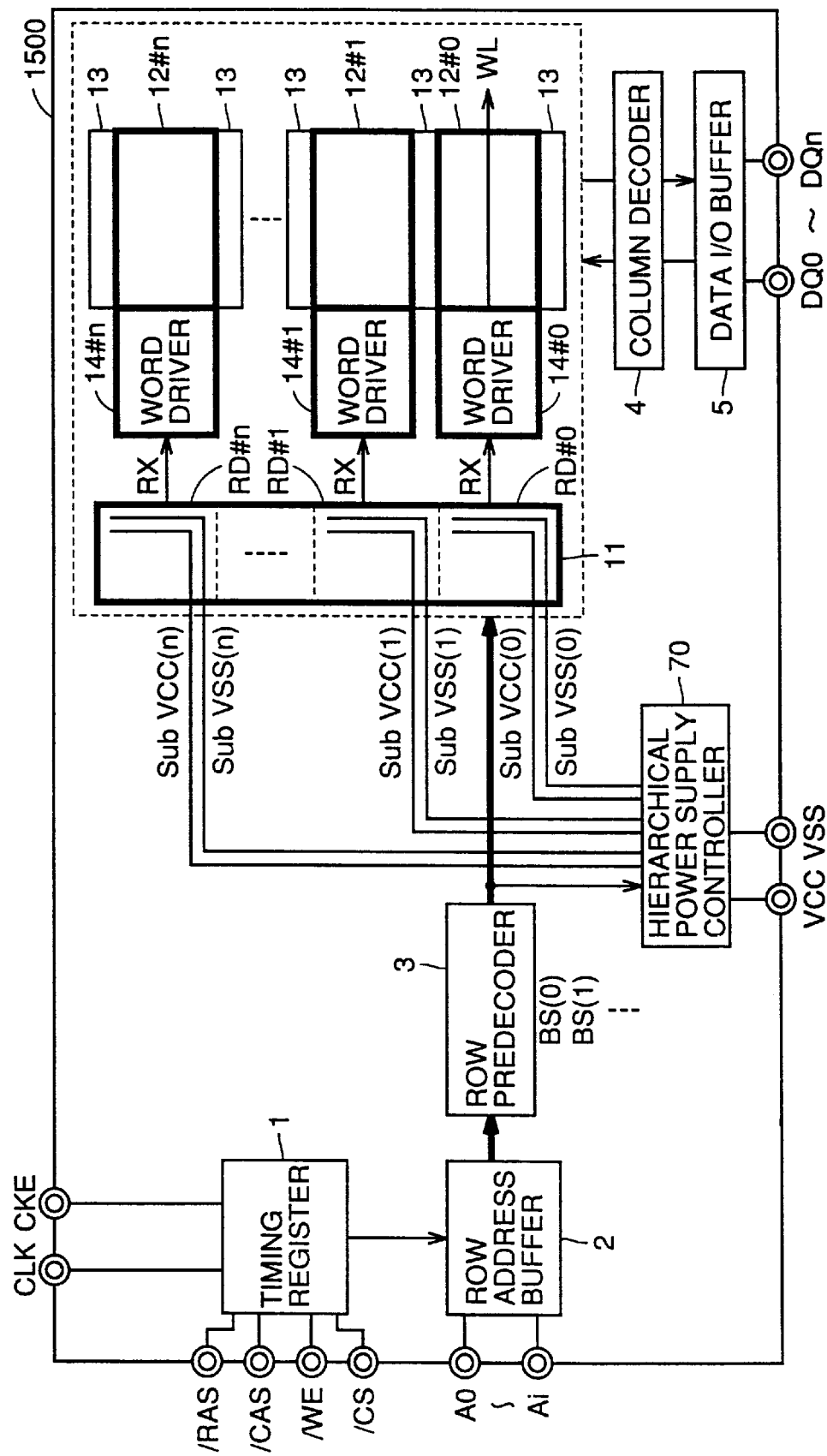
FIG. 7 shows an overall structure of the hierarchical power supply system when it is controlled by the decoding signal.
Figure 8:
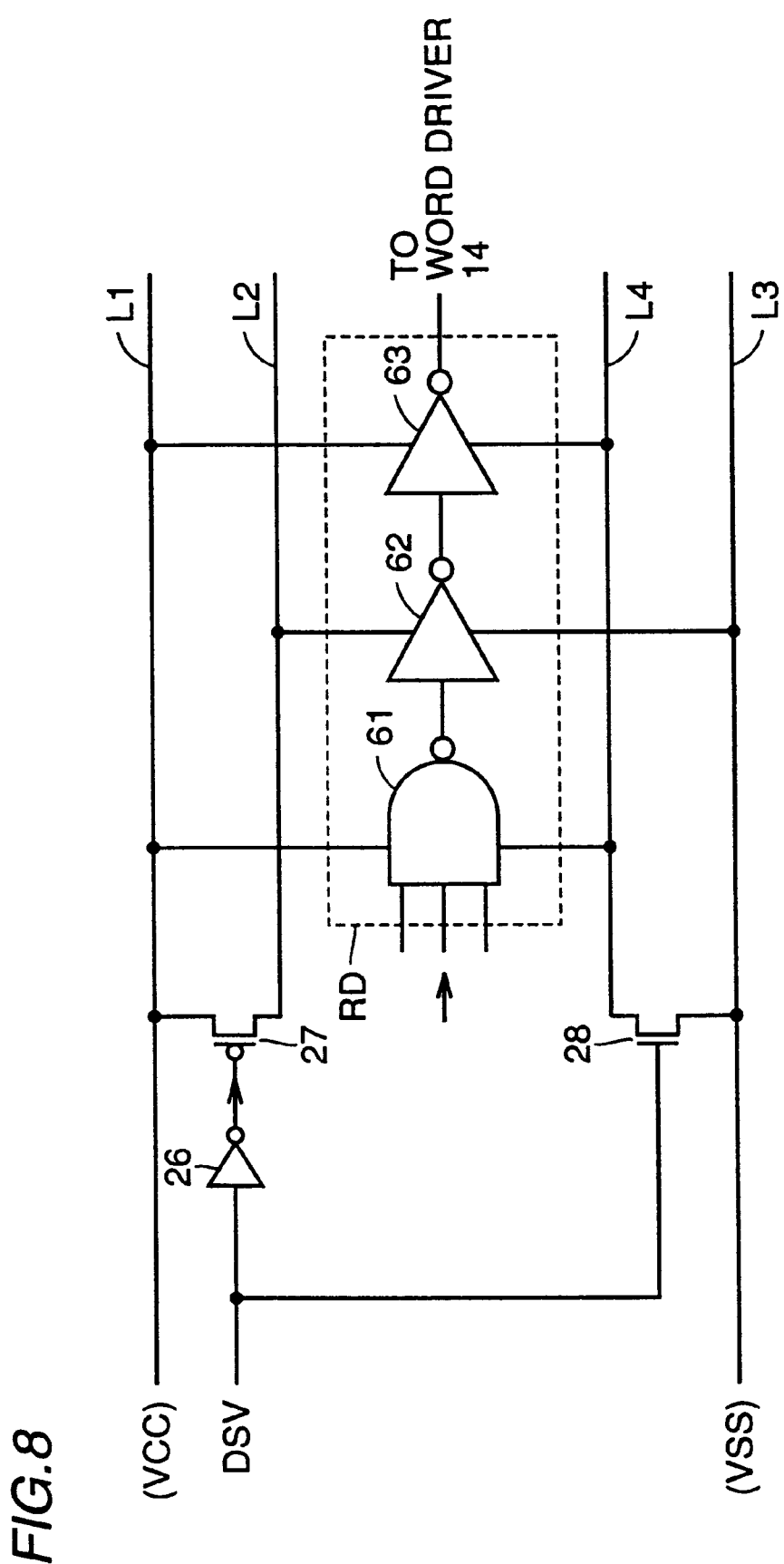
FIG. 8 is a diagram referenced for describing the hierarchical power supply system shown in FIG. 7.

Next, an effect of control by hierarchical power supply controller 10 according to the first embodiment of the present invention will be described with reference to FIGS. 7–10. FIG. 7 shows an overall structure when the hierarchical power supply system is controlled by the decoding signal. FIG. 8 is referenced for describing the hierarchical power supply system shown in FIG. 7.

A semiconductor memory device 1500 shown in FIG. 7 includes a hierarchical power supply controller 70 in place of hierarchical power supply controller 10 in semiconductor memory device 1000. Hierarchical power supply controller 70 controls a voltage of each sub power supply line based on block selection signals BS(0), BS(1), . . . received from row predecoder 3. Specifically, hierarchical power supply controller 70 generates a power supply control signal (hereinafter referred to as DSV) based on block selection signal BS. As shown in FIG. 8, switch transistors 27 and 28 are turned on/off based on power supply control signal DSV.

Figure 9:
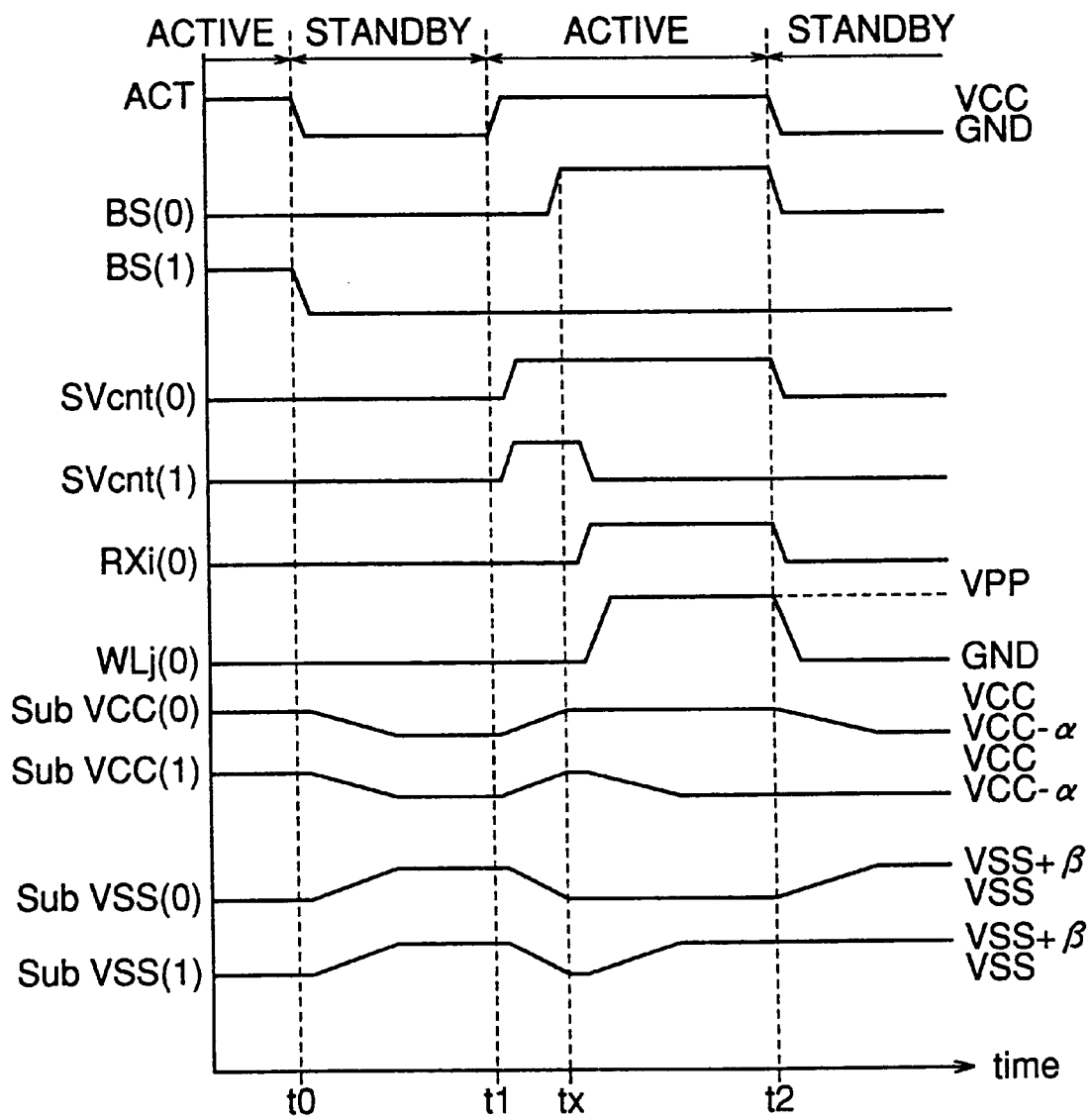
FIG. 9 is a timing chart referenced for describing an effect of hierarchical power supply controller 10 according to the first embodiment of the present invention.
Figure 10:
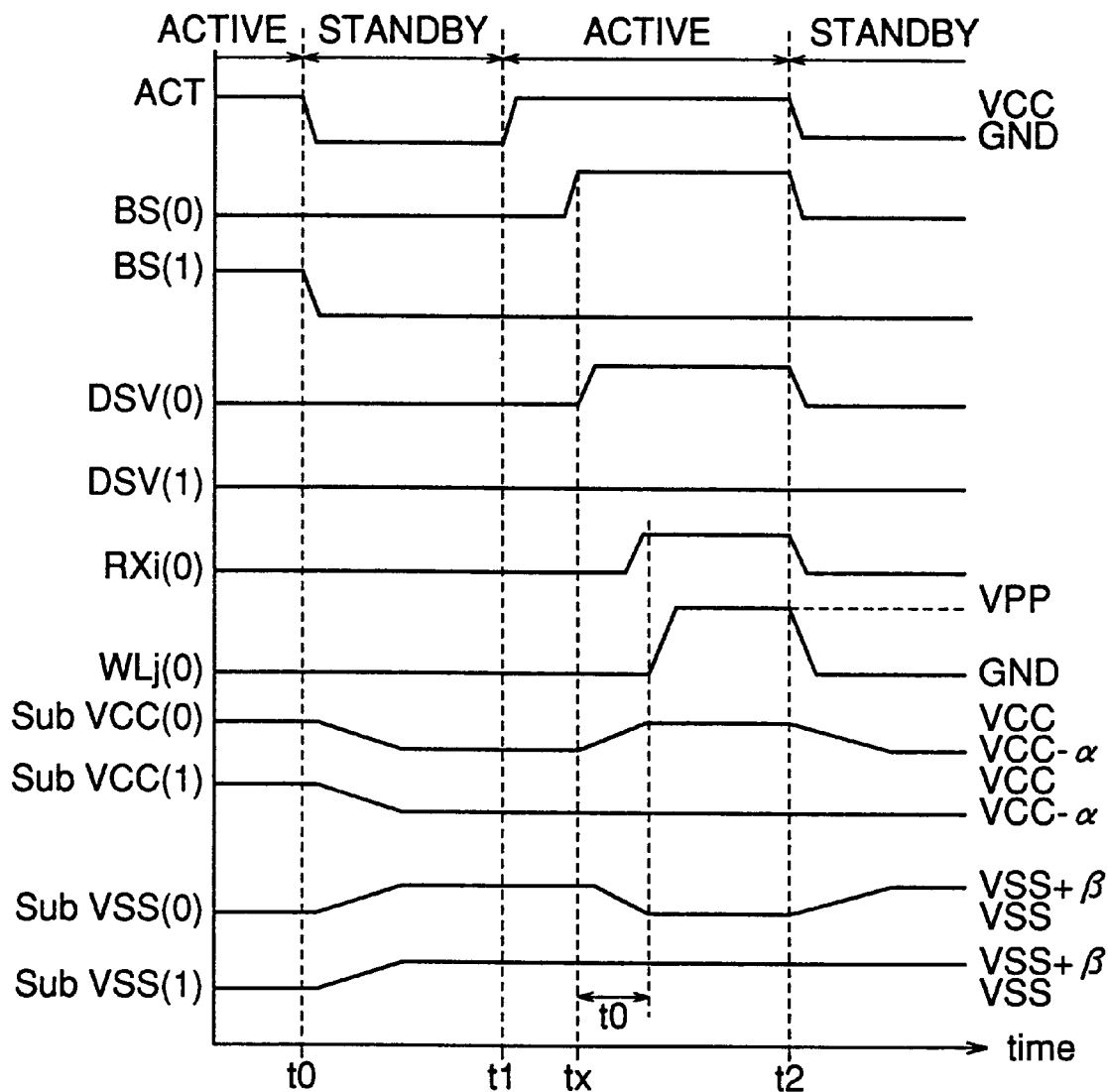
FIG. 10 is a timing chair referenced for describing an effect when a voltage of a sub power supply line is controlled with the use of the decoding signal.

FIG. 9 corresponds to semiconductor memory device 1000 according to the first embodiment of the present invention and FIG. 10 corresponds to semiconductor memory device 1500 in FIG. 7.

In FIGS. 9 and 10, character RXi(0) indicates a decoding signal supplied as an output from row decoder RD#0 and character WLj(0) indicates a word line driven by the decoding signal RXi(0).

In FIG. 9, character SVcnt(0) indicates a power supply control signal corresponding to row decoder RD#0 and character SVcnt(1) indicates a power supply control signal corresponding to row decoder RD#1. In FIG. 10, character DSV(0) indicates a power supply control signal corresponding to row decoder RD#0 and character DSV(1) indicates a power supply control signal corresponding to row decoder RD#1.

In FIGS. 9 and 10, transition from the active cycle to the standby cycle occurs at times t0 and t2, and transition from the standby cycle to the active cycle occurs at time t1. Bank activation signal ACT is set to an H level (VCC) in the active cycle and to an L level (GND) in the standby cycle. In the standby cycle, all block selection signals BS(0) and BS(1) are at an L level and all power supply control signals SVcnt(0), SVcnt(1), DSV(0), and DSV(1) are at an L level.

With reference to FIG. 9, bank activation signal ACT attains an L level at the point of transition from the active cycle to the standby cycle (time t0 and time t2). Then power supply control signals SVcnt(0) and SVcnt(1) attain an L level. Both switch transistors 27 and 28 are turned off. The main power supply voltage line L1 and sub power supply voltage line L2 are turned to the cut-off state, and additionally main ground voltage line L3 and sub ground voltage line L4 are turned to the cut-off state, for all row decoders RD. The sub power supply line is turned to the floating state.

Then voltages Sub VCC(0) and Sub VCC(1) of the sub power supply voltage line are turned to the level of (VCC−α), a voltage value α lower than power supply voltage VCC. Voltages Sub VSS(0) and Sub VSS(1) of the sub ground voltage line are turned to the level of (VSS+β), a voltage value β higher than ground voltage VSS. Then a leakage current is suppressed in the standby cycle.

At the transition from the standby cycle to the active cycle (time t1), bank activation signal ACT attains an H level. Immediately power supply control signals SVcnt(0) and SVcnt(1) attain an H level. Then switch transistors 27 and 28 are turned on. Main power supply voltage line L1 and sub power supply voltage line L2 are turned to a short circuit state, and additionally main ground voltage line L3 and sub ground voltage line L4 are turned to the short circuit state for all row decoders RD.

The voltage level of sub power supply voltage line L2 immediately after the short-circuit is lower than the voltage level of main power supply voltage line L1 and the voltage level of sub ground voltage line L4 is higher than the voltage level of main ground voltage line L3. Therefore the potential difference between the power supply of a logic circuit (an inverter) and ground is smaller than in the normal state. Hence, a certain amount of time is required until the voltage level of each power supply line recovers a desired value.

At time tx (here, t1<tx<t2), the result of decoding is output from row predecoder 3. At this point, the level of voltage Sub VCC(0) and Sub VCC(1) are turned from the level of (VCC−α) to the level of power supply voltage VCC. The levels of voltages Sub VSS(0) and Sub VSS(1) are turned from the level of (VSS+β) to the level of ground voltage VSS. This means the recovery of the voltage of the sub power supply line. Here, row decoder RD which is an internal circuit is turned to a state allowing activation prior to the decoding operation.

At time tx, block selection signal BS(0) attains an H level. Other block selection signals (block selection signal BS(1), for example) maintains an L level. Row decoder RD#0 outputs decoding signal RXi(0) at an H level immediately after the receipt of the results of decoding. As a result, a voltage of the corresponding word line WLj(0) is raised to the level of a boosted power supply voltage VPP.

On the other hand, a power supply control signal of row decoder RD except the signal of row decoder RD#0 (that is, power supply control signal SVcnt(1)) attains an L level based on the decoding result. Therefore voltage SVcnt(1) is turned to the level of (VCC−α) lower than the power supply voltage VCC by voltage value α, and voltage Sub VSS(1) is turned to the level of (VSS+β) higher than ground voltage VSS by voltage value β. Therefore a leakage current is suppressed for an internal circuit corresponding to a non-selected memory block.

With reference to FIG. 10, when the voltage of the sub power supply line is recovered based on the decoding signal, power supply control signal DSV(0) is turned to an H level after the rise of block selection signal BS(0) (after time tx). Then, the sub power supply line and the main power supply line form a short circuit.

As described above, however, a certain amount of time is required for the recovery of voltage level of each power supply line to a desired level. Therefore, row decoder RD cannot receive a desired operating power supply voltage until an elapse of time t0 after time tx. Thus the decoding operation of row decoder RD delays.

Hence, the operation of the row decoder can be speed up in the structure where the operating power supply voltage is supplied to row decoder RD prior to the decoding operation, compared with the structure where the operating power supply voltage is supplied to row decoder RD based on the decoding signal.

In addition, as for the sub power supply line and the sub ground line corresponding to the non-selected memory block, a leakage current is reduced by immediate deactivation after the activation.

Thus, the structure of the semiconductor memory device according to the first embodiment of the present invention has been described, where the voltage of the sub power supply line is rapidly recovered and the period of the recovery does not overlap with decoding operation in row decoder RD whereby delay is prevented. The structure described above is, however, applicable not only to row decoder RD but also to a hierarchical power supply system in other internal circuit such as a word driver.

Second Embodiment

A semiconductor memory device according to the second embodiment of the present invention will be described. The semiconductor memory device according to the second embodiment of the present invention allows a high speed operation by setting all word drivers to a state allowing activation thereof in response to the bank activation signal and then turning a state of a word driver corresponding to a non-selected memory block back to a reset state.

Figure 11:
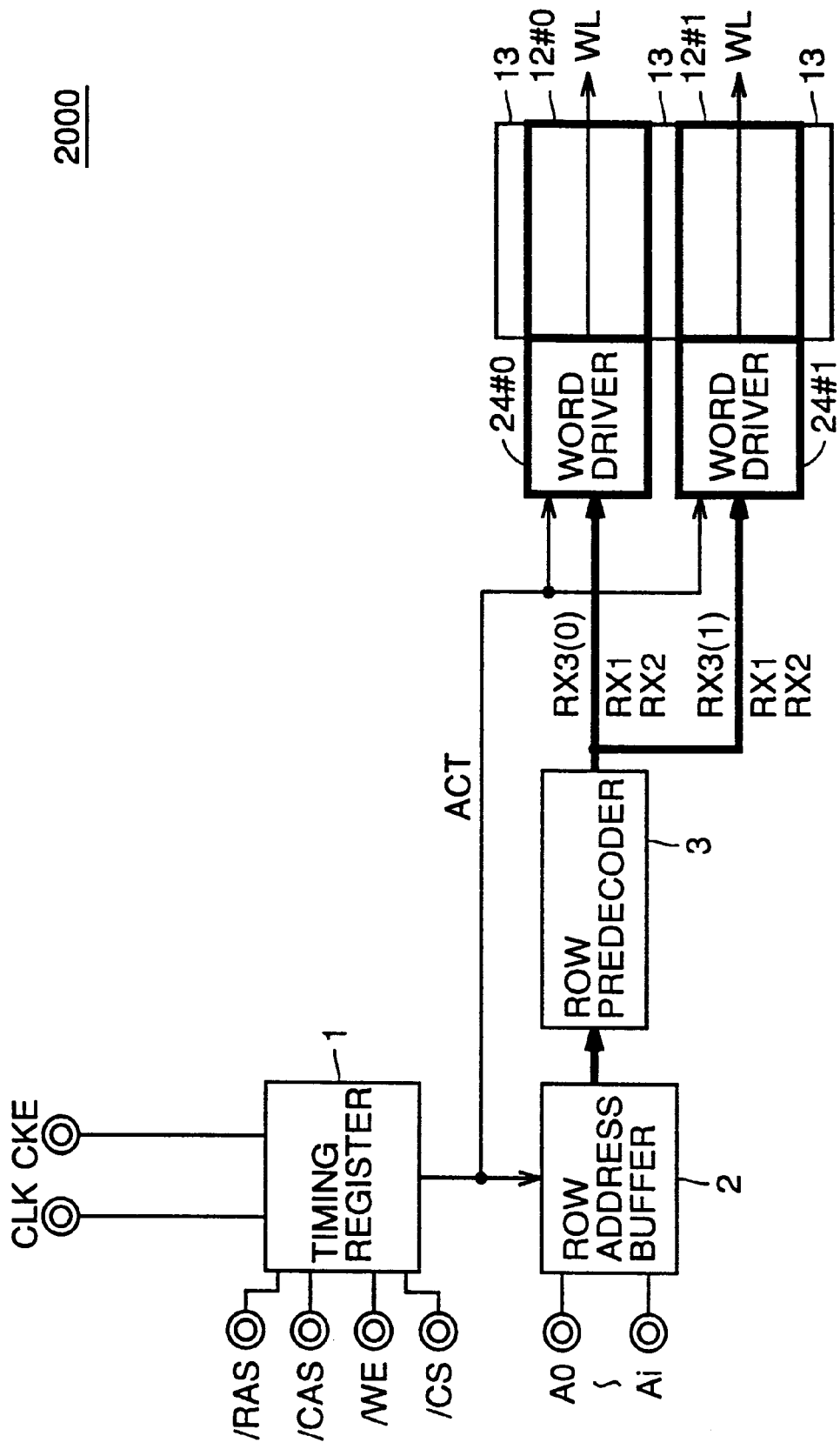
FIG. 11 is a block diagram showing a structure of a main portion of a semiconductor memory device 2000 according to a second embodiment of the present invention.

With reference to FIG. 11, a semiconductor memory device 2000 according to the second embodiment of the present invention will be described. Hereinafter, components corresponding to those in semiconductor memory device 1000 will be denoted by the same characters and the description thereof will not be repeated.

With reference to FIG. 11, semiconductor memory device 2000 includes a timing register 1, a row address buffer 2, a row predecoder 3, memory blocks 12#0 and 12#1, a sense amplifier block 13 and word drivers 24#0 and 24#1.

Word drivers 24#0 and 24#1 (hereinafter collectively referred to as word driver 24) are arranged corresponding to memory blocks, respectively. In response to bank activation signal ACT and decoding signals RX3(0), RX1 and RX2 supplied from row predecoder 3, word driver 24#0 turns a word line WL in memory block 12#0 to a selected state. In response to bank activation signal ACT and decoding signals RX3(1), RX1 and RX2 supplied from row predecoder 3, word driver 24#1 turns a word line WL in memory block 12#1 to a selected state.

Figure 12:
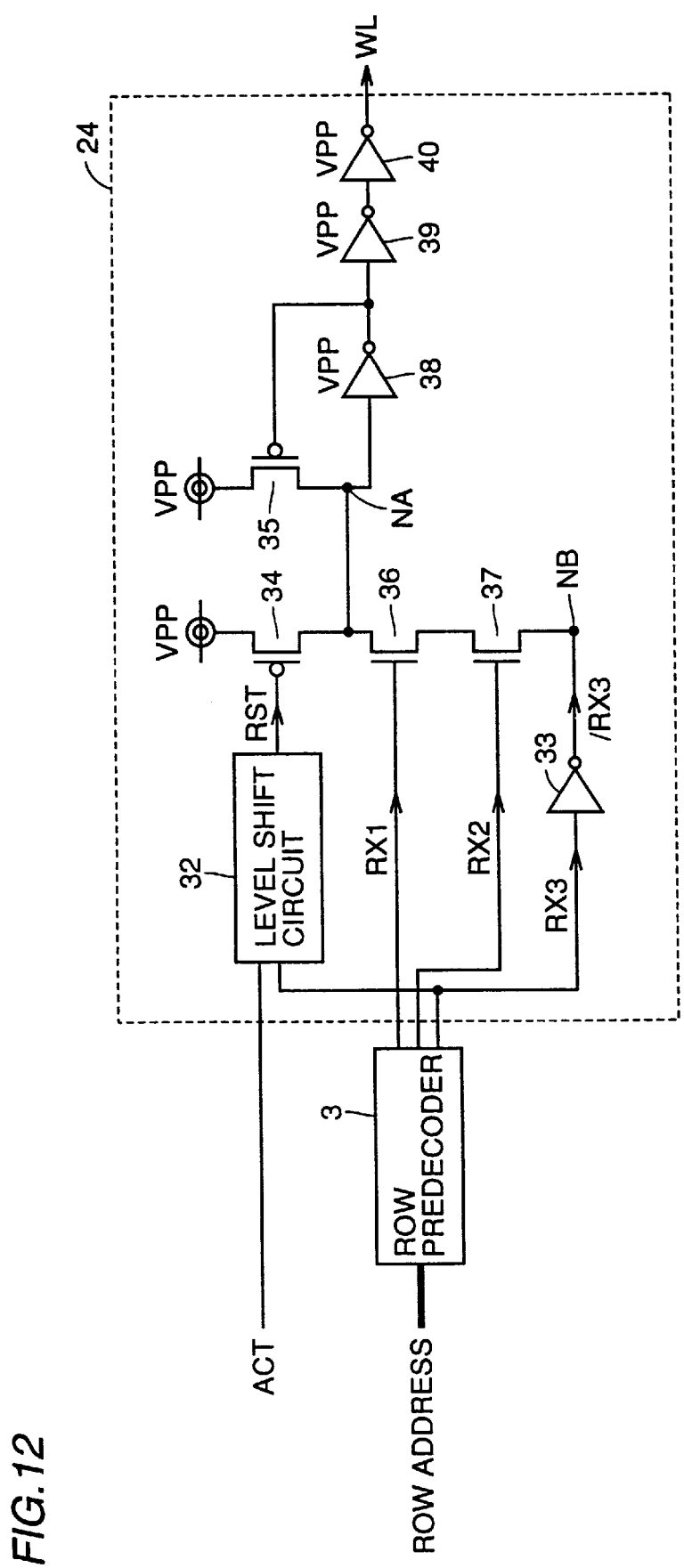
FIG. 12 is a schematic diagram referenced for describing a structure of a word driver shown in FIG. 11.

Next, a specific structure of word drivers 24#0 and 24#1 will be described with reference to FIG. 12. In FIG. 12, row predecoder 3 is also shown for reference.

With reference to FIG. 12, word driver 24 includes a level shift circuit 32, inverters 33, 38, 39 and 40, PMOS transistors 34 and 35, and NMOS transistors 36 and 37.

Row predecoder 3 outputs decoding signals RX1, RX2 and RX3 based on a row address received from row address buffer 2. Here, decoding signal RX3 corresponds to decoding signals RX3(0) and RX3(1) in FIG. 11. Signal RX3 corresponds to an uppermost position of the row address.

Level shift circuit 32 outputs a word line reset signal RST in response to bank activation signal ACT and decoding signal RX3. Inverter 33 is connected between an output node of row predecoder 3 and a node NB. Inverter 33 inverts decoding signal RX3 and outputs the resulting signal as decoding signal /RX3.

PMOS transistor 34 is connected between boosted power supply voltage VPP and a node NA and has a gate electrode receiving word line reset signal RST. NMOS transistors 36 and 37 are connected in series between node NA and node NB. NMOS transistor 36 has a gate electrode receiving decoding signal RX1. NMOS transistor 37 has a gate electrode receiving decoding signal RX2.

PMOS transistor 35 is connected between boosted power supply voltage VPP and node NA. Inverter 38 is connected between node NA and a gate electrode of PMOS transistor 35. Inverter 38 inverts a signal at node NA and outputs a signal at the level of ground potential or at the level of boosted power supply voltage VPP. Inverter 39 inverts the output of inverter 38 and outputs a signal at the level of ground potential or at the level of boosted power supply voltage VPP. Inverter 40 inverts the output of inverter 39 and supplies to a word line WL a signal at the level of ground potential or at the level of boosted power supply voltage VPP.

When word line reset signal RST is set to an L level, node NA attains an H level. When node NA is held at an H level, the output of inverter 40 is maintained at an L level. In other words, word driver 24 is maintained in the reset state.

When word line reset signal RST attains an H level, charge from PMOS transistor 34 to node NA stops. If decoding signal RX3 is at an H level (node NB is at an L level) in this state, the voltage level of node NA can be turned to the ground voltage level based on decoding signals RX1 and RX2. In other words, in this state the word driver can be activated.

Figure 13:
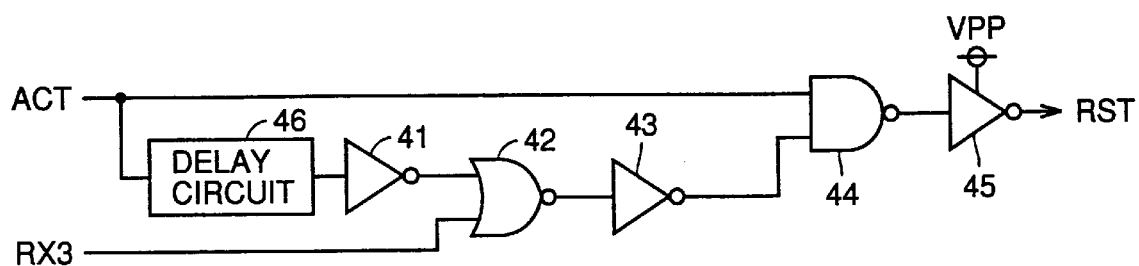
FIG. 13 is a schematic diagram showing a specific structure of a level shift circuit 32 shown in FIG. 12.

Next, with reference to FIG. 13, a specific structure of level shift circuit 32 shown in FIG. 12 will be described. With reference to FIG. 13, level shift circuit 32 includes a delay circuit 46, inverters 41, 43, and 45, an NOR circuit 42, and an NAND circuit 44.

Delay circuit 46 delays bank activation signal ACT and outputs the resulting signal. Inverter 41 inverts the output of delay circuit 46. NOR circuit 42 receives the output of inverter 41 and decoding signal RX3. Inverter 43 inverts the output of NOR circuit 42. NAND circuit 44 receives bank activation signal ACT and the output of inverter 43. Inverter 45 inverts the output of NAND circuit 44 and outputs word line reset signal RST at the level of ground potential or at the level of boosted power supply voltage VPP.

Figure 14:
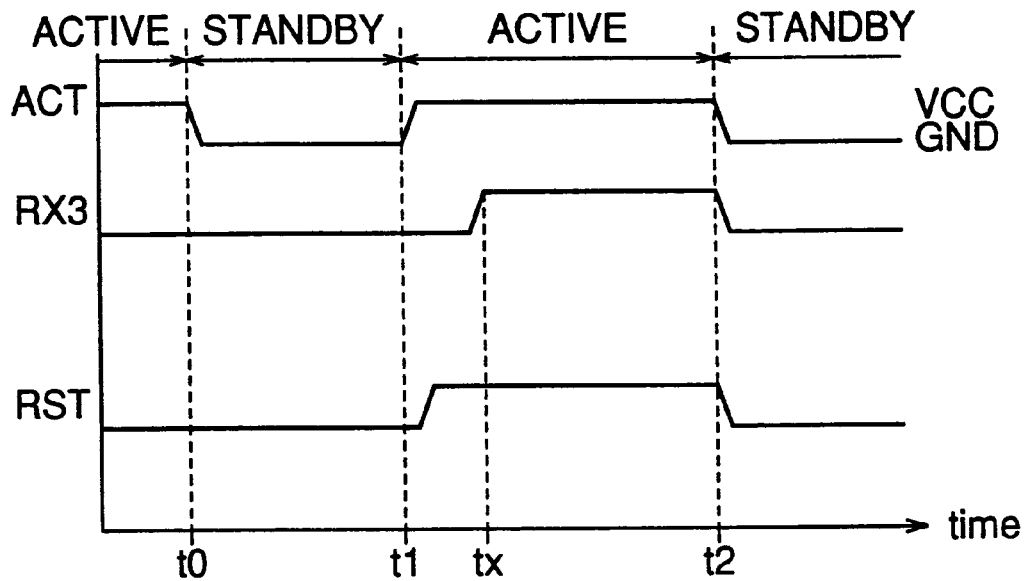
FIGS. 14 and 15 are timing charts referenced for describing an operation of level shift circuit 32 shown in FIG. 13.
Figure 15:
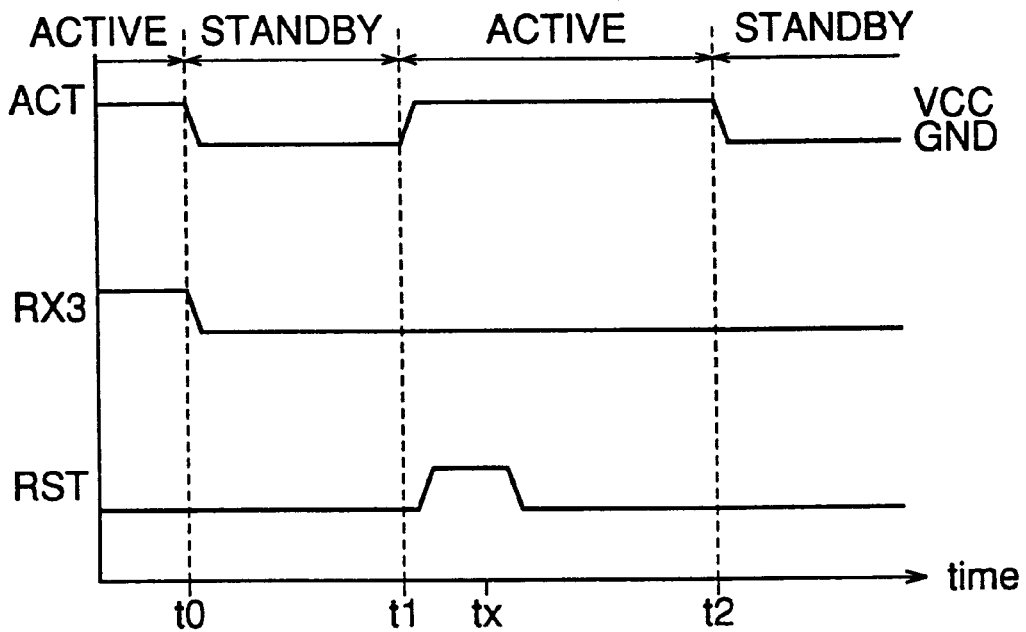

With reference to timing charts shown in FIGS. 14 and 15, an operation of level shift circuit 32 shown in FIG. 13 will be described. In FIGS. 14 and 15, transition from the active cycle to the standby cycle occurs at times t0 and t2, and transition from the standby cycle to the active cycle occurs at time t1. Bank activation signal ACT is set to an H level (VCC) in the active cycle and to an L level (GND) in the standby cycle. In the standby cycle, word line reset signal RST is at an L level for all word drivers.

With reference to FIG. 14, a case will be described when decoding signal RX3 attains an H level at time tx (<t2) after the transition from the standby cycle to the active cycle at time t1. In this case, word line reset signal RST attains an H level immediately after time t1. Then at the transition from the active cycle to the standby cycle at time t2, word line reset signal RST attains an L level.

Next with reference to FIG. 15, a case will be described when decoding signal RX3 maintains an L level after the transition from the standby cycle to the active cycle at time t1. In this case, word line reset signal RST once attains an H level immediately after time t1 and falls to an L level after the elapse of a predetermined amount of time (after time tx).

Figure 16:
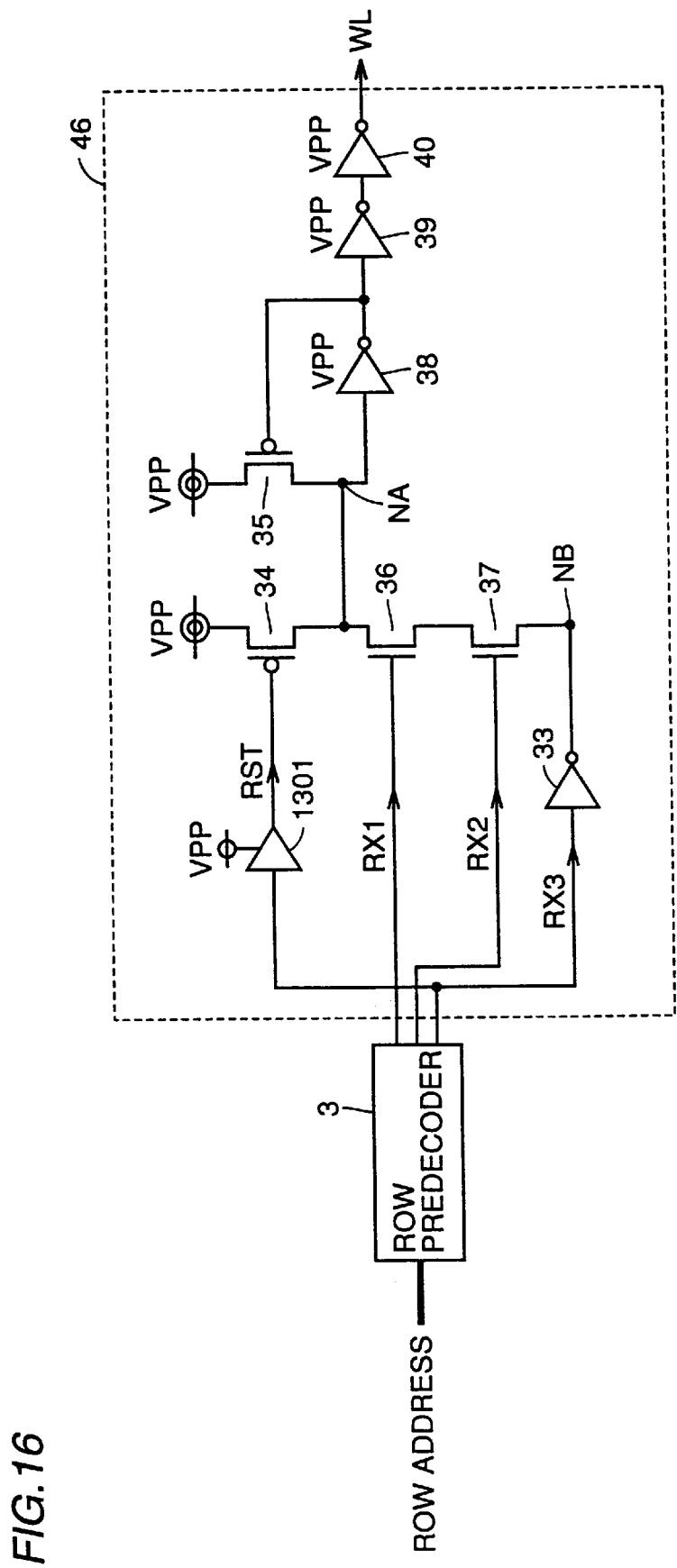
FIG. 16 is a schematic diagram showing an example of a structure of a word driver operated according to the decoding signal.
Figure 17:
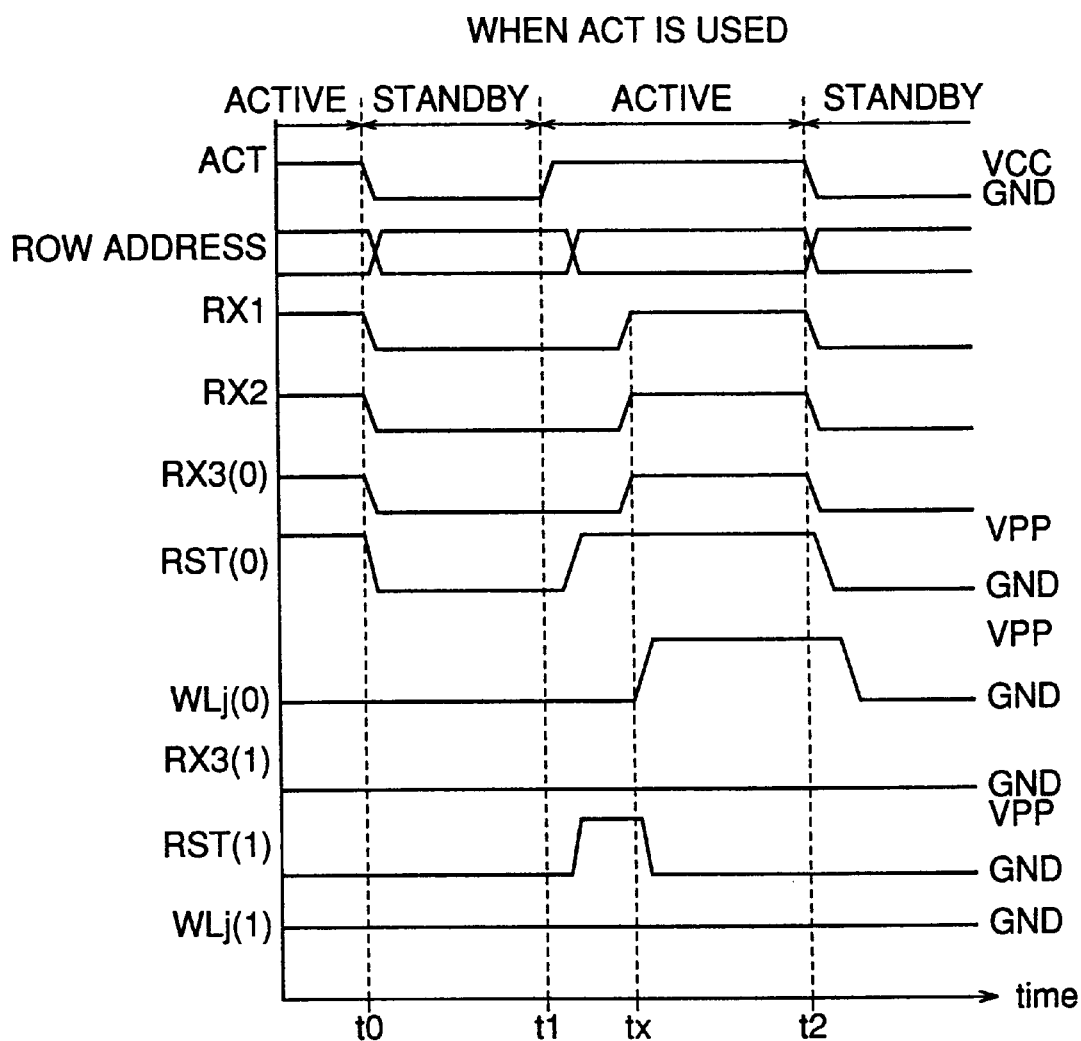
FIG. 17 is a timing chart referenced for describing an effect of a word driver 24 according to the second embodiment of the present invention.
Figure 18:
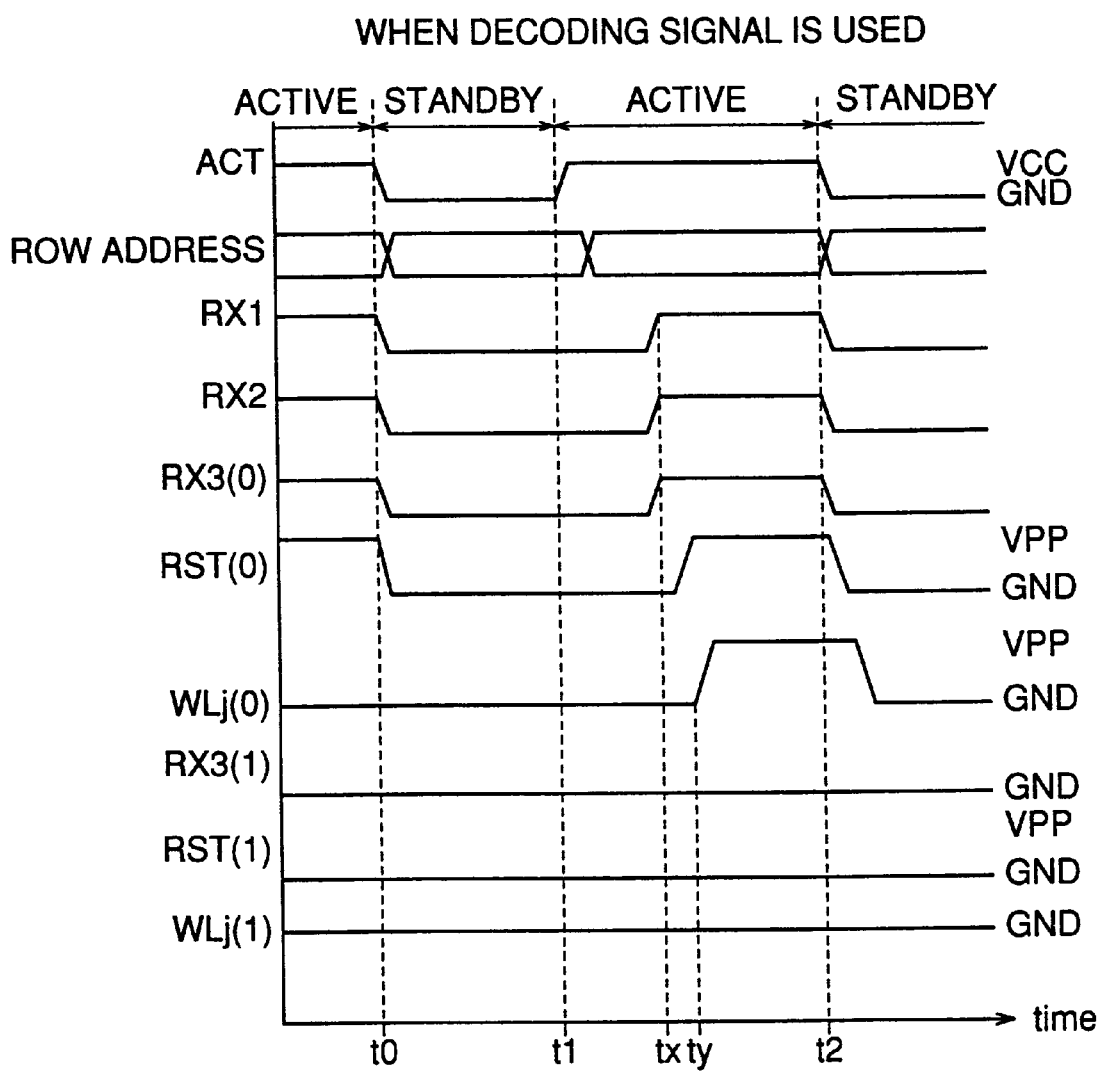
FIG. 18 is a timing chart referenced for describing an effect when the word driver is driven with the use of the decoding signal.
Figure 19:
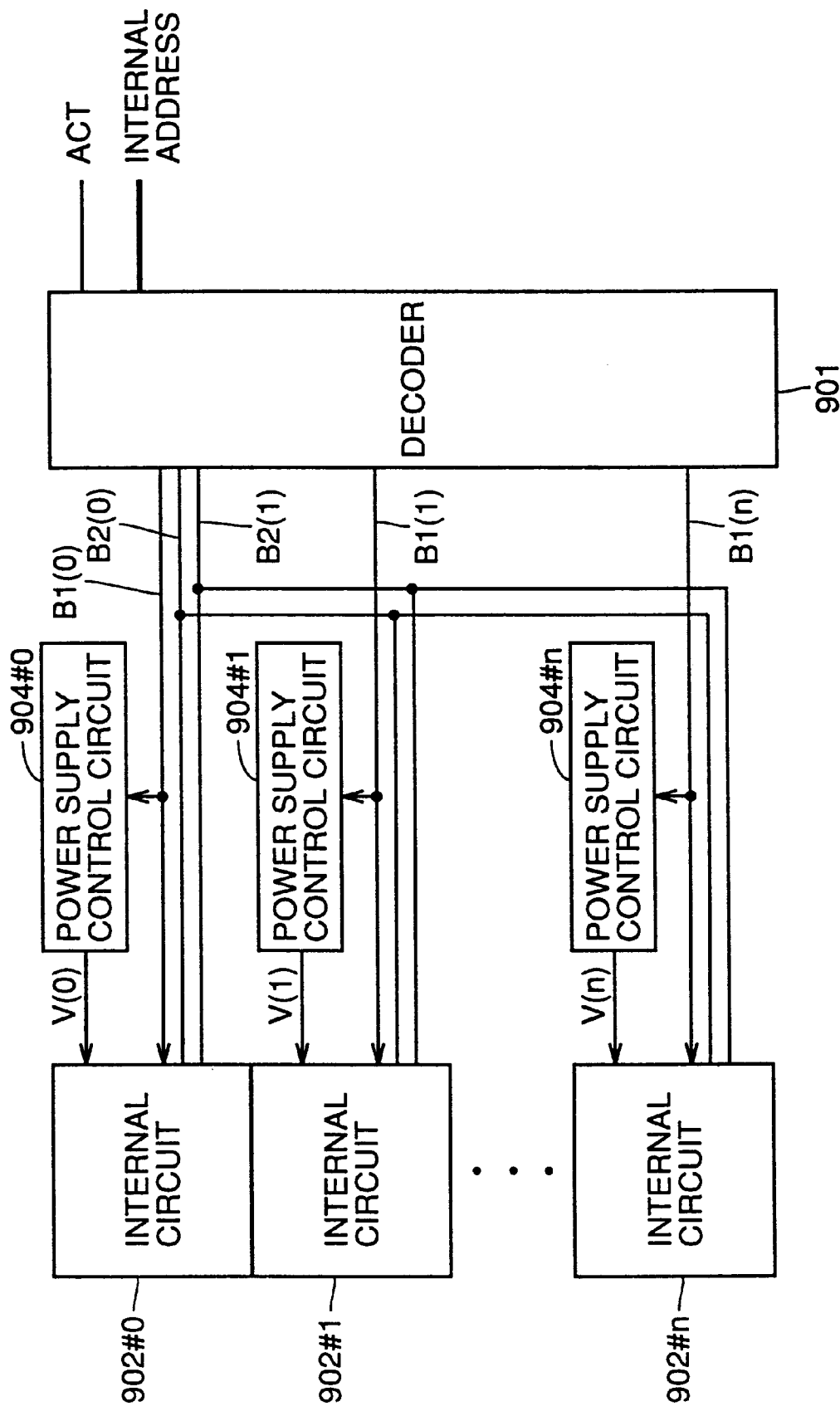
FIG. 19 is a diagram showing a structure of a main portion of a conventional semiconductor memory device.
Figure 20:
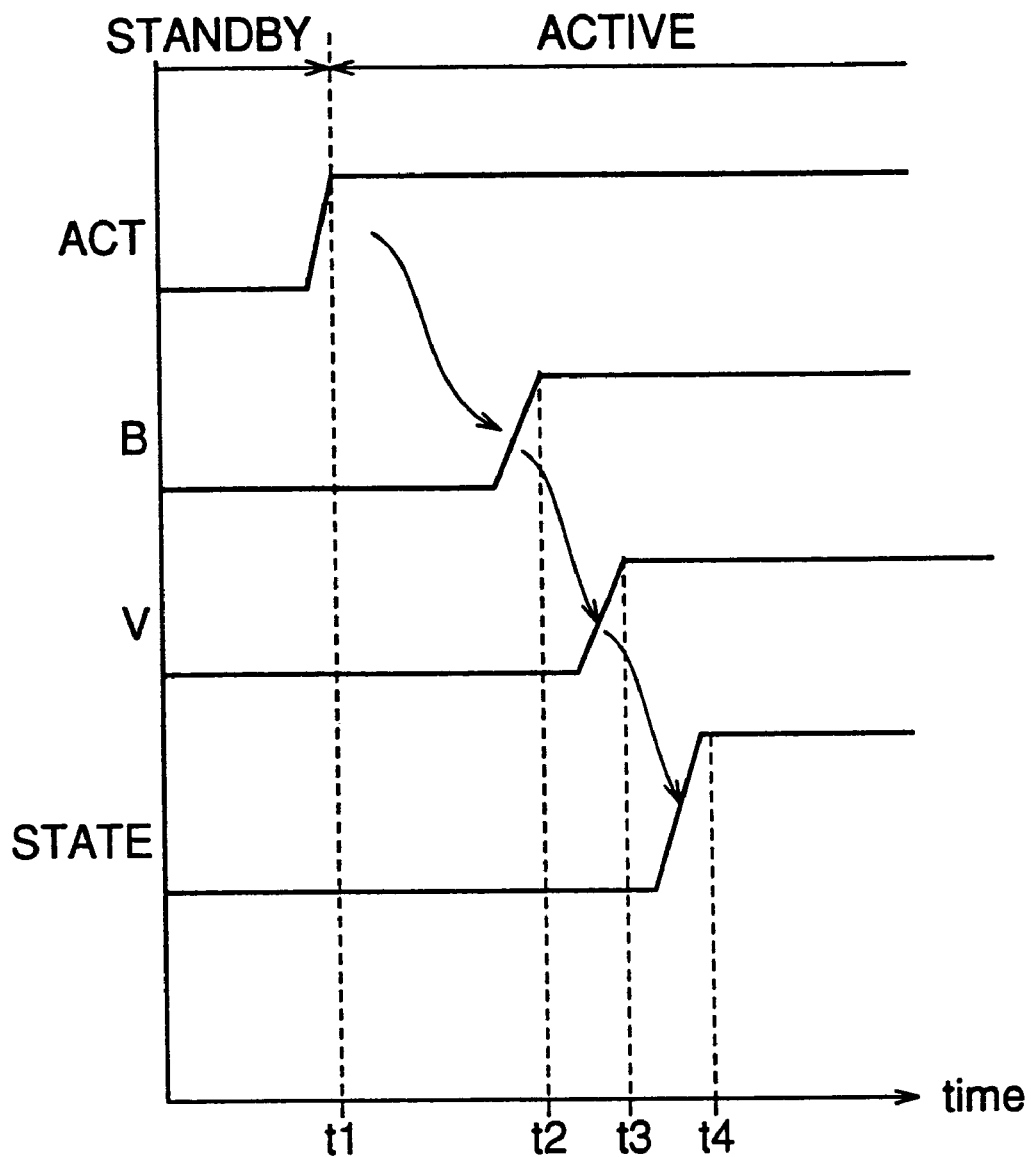
FIG. 20 is a timing chart referenced for describing a problem in the conventional semiconductor memory device.

With reference to FIGS. 16–18, an effect of activation timing of the word line according to the second embodiment of the present invention will be described.

FIG. 16 is a circuit diagram in which PMOS transistor 34 shown in FIG. 12 is driven by the decoding signal. A word driver 46 shown in FIG. 16 includes a level shift circuit 1301 in place of level shift circuit 32. Level shift circuit 1301 operates utilizing boosted power supply voltage VPP as an operating power supply, changes the level of decoding signal RX3 supplied from row predecoder 3 and outputs word line reset signal RST.

FIG. 17 corresponds to word driver 24 according to the second embodiment of the present invention and FIG. 18 corresponds to word driver 46 shown in FIG. 16.

In FIG. 17, character RX3(0) indicates a decoding signal for word driver 24#0 and character RX3(1) indicates a decoding signal for word driver 24#1. In addition, character RST(0) indicates a word line reset signal for word driver 24#0 and RST(1) indicates a word line reset signal for word driver 24#1. Further, character WLj(0) indicates a state of a word line driven by word driver 24#0 and character WLj(1) indicates a state of a word line driven by word driver 24#1.

FIG. 18 shows a case where word driver 46 is employed as word drivers 24#0 and 24#1.

In FIGS. 17 and 18, transition from the active cycle to the standby cycle occurs at time t0 and time t2, and transition from the standby cycle to the active cycle occurs at time t1. Bank activation signal ACT is set to an H level (VCC) in the active cycle and to an L level (GND) in the standby cycle. In the standby cycle, word line reset signal (RST(0), RST(1)) are in an L level for all the word drivers.

With reference to FIG. 17, assume that decoding signal RX3(0) attains an H level and decoding signal RX3(1) maintains an L level at time tx (t1<tx<t2) in the active cycle. Immediately after the transition from the standby cycle to the active cycle at time t1, word line reset signals RST(0) and RST(1) attain an H level. Then in this state word drivers 24#0 and 24#1 can be activated.

Thereafter, word line reset signal RST(0) maintains an H level. In response to decoding signals RX1, RX2 and RX3(0), word driver 24#0 turns corresponding word line WLj(0) to an H level (VPP). If the transition from the active cycle to the standby cycle occurs at time t2, word line reset signal RST(0) attains an L level.

On the other hand, word line reset signal RST(1) once rises to an H level and then attains an L level, that is, turns to the reset state, in response to decoding signal RX3(1). As a result, the corresponding word line WLj(1) maintains an L level.

With reference to FIG. 18, if word line reset signals RST(0) and RST(1) are generated in response to the decoding signals, word line reset signal RST(0) attains an H level after the generation of the decoding signals (after time tx). In other word, the word driver is turned to a state allowing activation thereof after the generation of the decoding signals. Therefore, word line WLj(0) attains an H level at time ty after the time of decoding signal generation (time tx). Thus compared with the case shown in FIG. 17, the activation timing of the word line delays.

Thus, word driver 24 according to the second embodiment of the present invention speeds up the timing of turning PMOS transistor 34 off by bank activation signal ACT. Hence, word driver 24 turns to a state allowing activation thereof immediately after the transition from the standby cycle to the active cycle, whereby the word line can be driven at high speed.

The activation timing of the word line can be fastened also by turning word driver 24 into a state allowing activation thereof, by employing a signal other than bank activation signal ACT, which is generated at a faster timing than the generation of decoding signals RX1, RX2 and RX3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory blocks each including a plurality of memory cells;
    a decoder responsive to an external address for outputting a decoding signal for selecting a particular memory block among said plurality of memory blocks;
    a plurality of internal circuits, coupled and provided corresponding to said plurality of memory blocks, respectively, for selectively controlling an operation of a corresponding memory block based on a corresponding decoding signal supplied from said decoder; and a control circuit, coupled to said plurality of internal circuits, to turn each of said plurality of internal circuits into an active state prior to a decoding operation in said decoder, and to selectively maintain said active state or turn to an inactive state based on said decoding signal in an active cycle.

2. The semiconductor memory device according to claim 1, wherein said plurality of internal circuits each include, a logic circuit receiving an operating power supply voltage to operate, said control circuit includes a plurality of power supply control circuits, said plurality of power supply control circuits being provided corresponding to said plurality of internal circuits, respectively, and supplying said operating power supply voltage to a corresponding logic circuit in response to a particular activation signal activated at a faster timing than said corresponding decoding signal, and selectively stopping the supply of said operating power supply voltage based on said corresponding decoding signal in said active cycle.

3. The semiconductor memory device according to claim 2, wherein said operating power supply voltage includes a voltage of a higher potential and a voltage of a lower potential, and wherein said plurality of power supply control circuits each include:

a first main power supply line receiving said operating power supply voltage of said higher potential, a first sub power supply line, a second main power supply line receiving said operating power supply voltage of said lower potential, a second sub power supply line, a first switch connecting said first main power supply line and said first sub power supply line, a second switch connecting said second main power supply line and said second sub power supply line, and a circuit turning said first switch and said second switch on in response to said particular activation signal and off in response to said corresponding decoding signal in an inactive state in said active cycle, and said logic circuit includes;

a first logic gate operating based on said operating power supply voltage supplied from said first main power supply line and said second sub power supply line, performing a predetermined logic operation on supplied input and outputting a first resulting signal, and a second logic gate operating based on said operating power supply voltage supplied from said first sub power supply line and said second main power supply line, performing a predetermined logic operation on supplied input and outputting a second resulting signal.

4. The semiconductor memory device according to claim 1, wherein said plurality of internal circuits each include, a word line driving circuit being turned into a state allowing activation in response to a particular activation signal activated at a faster timing than said decoding signal and turned to a reset state if said corresponding decoding signal is in an inactive state in said active cycle.

5. The semiconductor memory device according to claim 4, wherein said plurality of memory blocks each further include, a plurality of word lines for selecting a plurality of memory cells arranged in a row direction among said plurality of memory cells, and said word line driving circuit turns a corresponding word line among said plurality of word lines to a selected/non-selected state, and said control circuit includes a plurality of reset control circuits, said plurality of reset control circuits provided corresponding to said plurality of internal circuits, respectively and turning a corresponding word line driving circuit to the state allowing activation thereof in response to said particular activation signal activated at a faster timing than said corresponding decoding signal, and to said reset state based on said corresponding decoding signal in said active cycle.

* * * * *